(12) United States Patent
Warner et al.

(10) Patent No.: US 6,716,671 B2
(45) Date of Patent: Apr. 6, 2004

(54) METHODS OF MAKING MICROELECTRONIC ASSEMBLIES USING COMPRESSED RESILIENT LAYER

(75) Inventors: Mike Warner, San Jose, CA (US); Elliott Pflughaupt, Los Gatos, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/811,803

(22) Filed: Mar. 19, 2001

(65) Prior Publication Data

US 2001/0049158 A1 Dec. 6, 2001

Related U.S. Application Data

(60) Provisional application No. 60/190,464, filed on Mar. 17, 2000.

(51) Int. Cl.[7] .......................... H01L 21/44; H01L 21/48; H01L 21/50
(52) U.S. Cl. .......................... 438/108; 438/112; 438/117
(58) Field of Search .............................. 438/108, 112, 438/117, 122, 124; 257/675, 719, 778, 786, 787, 789; 29/840

(56) References Cited

U.S. PATENT DOCUMENTS

| | | | |
|---|---|---|---|
| 5,518,964 A | * 5/1996 | DiStefano et al. | 438/113 |
| 5,659,952 A | 8/1997 | Kovac et al. | 29/840 |
| 5,695,952 A | * 12/1997 | Honda et al. | 435/252.2 |
| 5,763,941 A | * 6/1998 | Fjelstad | 257/669 |
| 5,806,181 A | * 9/1998 | Khandros et al. | 29/840 |
| 5,829,128 A | * 11/1998 | Eldridge et al. | 228/180.21 |
| 5,832,601 A | * 11/1998 | Eldridge et al. | 257/620 |
| 5,848,467 A | * 12/1998 | Khandros et al. | 29/832 |
| 5,904,498 A | 5/1999 | Fjelstad | 438/106 |
| 6,133,639 A | * 10/2000 | Kovac et al. | 257/778 |
| 6,169,328 B1 | 1/2001 | Mitchell et al. | 257/778 |
| 6,261,863 B1 | * 7/2001 | Beroz et al. | 438/106 |
| 6,357,112 B1 | * 3/2002 | DiStefano et al. | 228/180.5 |

FOREIGN PATENT DOCUMENTS

| WO | WO 94/03036 | 3/1994 |
|---|---|---|

\* cited by examiner

*Primary Examiner*—George Fourson
*Assistant Examiner*—Fernando Toledo
(74) *Attorney, Agent, or Firm*—Lerner, David, Littenberg, Krumholz & Mentlik, LLP

(57) ABSTRACT

A method of making a microelectronic assembly comprises providing a first side assembly juxtaposed with a second side assembly and a first resilient element disposed therebetween. Leads extend between the first side assembly and the second side assembly. A compressive force is applied to the juxtaposed assemblies so as to compress the first resilient element and the compressive force is at least partially released so as to allow the first resilient element to expand, thereby moving one or both of the first side assembly and the second side assembly to deform the leads.

38 Claims, 7 Drawing Sheets

METHODS OF MAKING
MICROELECTRONIC ASSEMBLIES USING
COMPRESSED RESILIENT LAYER

CROSS-REFERENCE TO RELATED APPLICATIONS

This application claims benefit of U.S. provisional application No. 60/190,464, filed Mar. 17, 2000, the disclosure of which is hereby incorporated by reference herein.

FIELD OF THE INVENTION

The present invention relates to methods and components for making microelectronic assemblies.

BACKGROUND OF THE INVENTION

Certain techniques for making semiconductor chip assemblies and similar microelectronic assemblies involve attaching leads to a microelectronic element and deforming the leads. One such process is disclosed in commonly assigned U.S. Pat. No. 5,518,964, the disclosure of which is hereby incorporated by reference herein. In certain embodiments described in the '964 patent, a first element such as a dielectric layer in a connection component is provided with a plurality of elongated, flexible leads extending along a surface of the element. Each lead has a terminal end permanently attached to the first element and has a tip end offset from the terminal end. The tip ends of the leads may be releasably secured to the first element. The contacts of a second element such as a semiconductor chip are engaged with the first element or connection component, and the tip ends of the leads are bonded to contacts. The elements are then moved away from one another so as to deform the leads and provide vertically extensive leads extending between the first and second elements, i.e., between the chip and the connection component. A compliant material may be introduced between the chip and the connection component.

One method of moving the first element with respect to the second element in order to deform the leads is to provide opposed platens. Each platen engages one of the first element and the second element and moves the first element with respect to the second element. The platens are attached to conventional drive mechanisms for accomplishing the same. The platens may be moved a predetermined distance in one or more directions to deform the leads to a desired shape or to a desired vertical dimension.

Despite the foregoing improvements, further advancement in microelectronic assemblies is desirable.

SUMMARY OF THE INVENTION

The present invention addresses these needs.

In one aspect of the present invention, a method of making a microelectronic assembly comprises providing a first side assembly having a top surface and an oppositely facing bottom surface and a second side assembly having a first surface, the first surface being juxtaposed with the bottom surface. Leads are provided so that they extend between the first side assembly and the second side assembly and a first resilient element is disposed between the first side assembly and the second side assembly. A compressive force is applied to the juxtaposed assemblies so as to compress the first resilient element. The compressive force is at least partially released so that the first resilient element expands, thereby moving one or both of the first side assembly and second side assembly to deform the leads. After applying the compressive force, controlled movement of the elements of the assembly is no longer required. The resilient element is allowed to expand in order to deform the leads into the desired configuration.

The step of providing a first side assembly preferably includes providing a microelectronic element. The First resilient element may be attached to the first side assembly. The leads desirably extend between the microelectronic element and the second side assembly.

The leads preferably include a first end and a second end. In certain preferred embodiments, the first ends of the leads are preferably bonded to contacts on the microelectronic element and the second ends of the leads are attached to the second side assembly.

The first side assembly may comprise a frame having an aperture for receiving a microelectronic element, which may be inserted into the aperture.

The second side assembly may comprise a flexible dielectric layer.

The first resilient element preferably comprises a material having a low compression set and more preferably has a final height after removing the compressive force of 80% to 100% of the initial height before the compressive force is applied. The low compression set material may comprise, for example, a flexibilized epoxy. The first resilient element may be porous.

Providing the first side assembly may include providing an auxiliary element and providing the first resilient element between the auxiliary element and the second side assembly. The auxiliary element may be disposed in a number of positions with respect to the microelectronic element. In certain embodiments, the auxiliary element is disposed adjacent the microelectronic element and confronts the first side assembly, the second side assembly or both. The auxiliary element may have a central region extending over a surface of the microelectronic element and a peripheral region lying outwardly of the central region and the first resilient element includes at least one resilient pad disposed between the peripheral region and the second side assembly. The central region of the auxiliary element may be attached to the microelectronic element.

In certain embodiments, the auxiliary element comprises at least one post extending alongside the microelectronic element. The first resilient element is attached to the at least one post so that the resilient element extends between the at least one post and the second side assembly and attached to the microelectronic element.

The leads may be provided so that first ends of the leads are permanently attached to the second side assembly and second ends of the leads are releasably attached to the second side assembly. As the compressive force is at least partially released, the second ends of the leads are preferably peeled from the second side assembly.

In certain preferred embodiments, the first resilient element may be provided by stencil printing a composition onto at least one of the first side assembly and the second side assembly. The composition may be a curable composition and the curable composition may be cured to form the first resilient element.

The method desirably includes providing a structure and juxtaposing the structure over the microelectronic element. The structure may comprise a heat spreader and a second resilient element is desirably applied to a surface of the structure facing the microelectronic element. Adhesive may be applied to a surface of the structure which faces the microelectronic element. The adhesive may be curable and the method may include curing the adhesive while applying the compressive force. The structure may be attached to the first side assembly. Alternatively, the method may include juxtaposing a coverlay over the structure and attaching the coverlay to the first side assembly.

The deformed leads are preferably encapsulated by disposing a curable composition around the leads and curing the composition. The cured composition is preferably compliant.

In certain preferred embodiments, the first side assembly includes a plurality of microelectronic elements. The second side assembly comprises a dielectric layer and the method may further comprise cutting through the dielectric layer around the microelectronic elements. The first side assembly may comprise a wafer having a plurality of microelectronic elements.

The compressive force may be applied by applying an elevated pressure to a surface of the first side assembly that faces away from the second side assembly. In the alternative, a vacuum is applied to a surface of the first side assembly that faces the second side assembly.

The leads may be comprised of any conductive material, such as, for example, copper, gold, gold alloys and copper allows.

Other conductive elements may be included in the assembly. Solder balls may be attached to the second side assembly, preferably so that they are connected to the leads. The first side assembly may include a conductive plane disposed on a bottom surface thereof.

Another aspect of the invention is a microelectronic package made by providing a first side assembly having a top surface and an oppositely facing bottom surface and a second side assembly having a first surface, the first surface being juxtaposed with the bottom surface. Leads are provided so that they extend between the first side assembly and the second side assembly and a first resilient element is disposed between the first side assembly and the second side assembly. A compressive force is applied to the juxtaposed assemblies so as to compress the first resilient element. The compressive force is at least partially released so that the first resilient element expands, thereby moving one or both of the first side assembly and second side assembly to deform the leads.

BRIEF DESCRIPTION OF THE DRAWINGS

These and other features, aspects and advantages of the present invention will become better understood with regard to the following description, appended claims, and accompanying drawings where:

DETAILED DESCRIPTION

Figure 1:
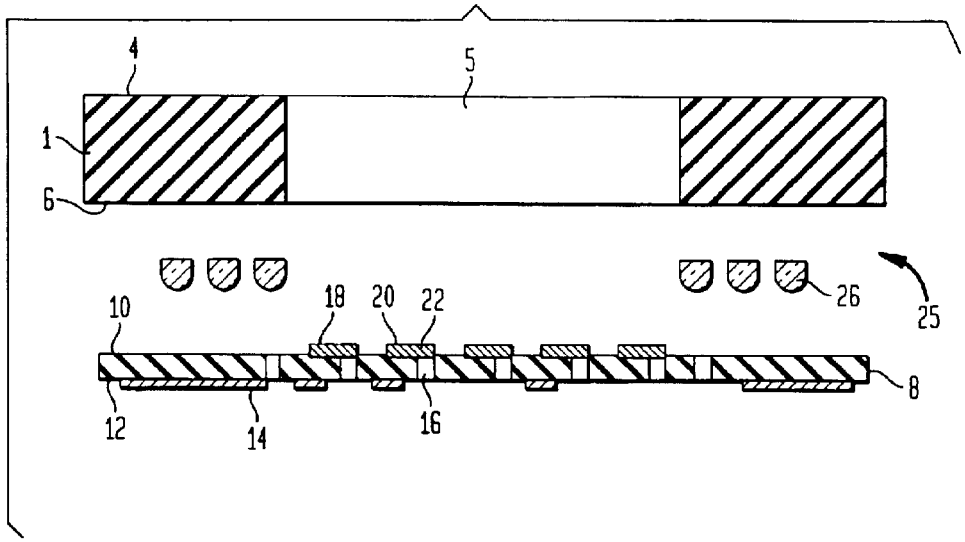
FIG. 1 is a cross-sectional view of a first side assembly, second side assembly and resilient layer in accordance with an embodiment of the invention.

A method of making a microelectronic assembly according to an embodiment of the present invention is depicted in FIGS. 1–11 and includes providing a first side assembly 1 having a top surface 4 and a bottom surface 6 facing in a direction opposite to the top surface 4. Descriptors such as "top", "bottom", "beneath", "overlying", etc, should be understood to be relative to the structure itself, rather than any gravitational frame of reference.

The first side assembly 1 preferably has an aperture 5 and, in certain preferred embodiments, comprises a carrier frame having an aperture. The aperture 5 is preferably sized to accommodate a microelectronic element.

In preferred embodiments, the first side assembly 1 is comprised of a material selected from the group consisting of FR-4, FR-5, glass-epoxies, glass phenolics and BTC. The first side assembly may comprise any sheet of material. The first side assembly may comprise a sheet of metal.

A second side assembly 8 is provided. The second side assembly 8 has a first surface 10 facing the bottom surface 6 of the first side assembly 1 and a second surface 12 facing oppositely from first surface 10. The first side assembly 1 is adapted to support the second side assembly during some or all of the steps for making a microelectronic assembly and some or all of first side assembly 1 may become part of the final microelectronic assembly.

The second side assembly may comprise any layer, such as a dielectric layer. In preferred embodiments, the second side assembly 8 comprises a flexible dielectric layer. In highly preferred embodiments, the second side assembly comprises a layer of polyimide.

A plurality of first electrically conductive features are disposed on the first surface 10 and, in certain preferred embodiments, a plurality of second electrically conductive features 14 are disposed on the second surface 12. For example, first electrically conductive features may comprise leads 18 extending on the first surface 10 and second electrically conductive features 14 may comprise traces extending on the second surface 12. The second electrically conductive features 14, in certain preferred embodiments, comprise traces connected to the leads 18 through conductive vias in the second side assembly 8. The electrically conductive elements comprise an electrically conductive metal, such as copper or gold. In addition, the conductive features may comprise layers of different metals, or include layers of other materials, such as dielectric materials.

The second side assembly 8 may be formed using conventional methods. For example, conductive features may be formed on one or both sides of a dielectric layer using photolithography, electroplating or other deposition techniques, or other known methods.

Each lead 18 has a first end 20 and a second end 22. The second end 22 of each lead is permanently attached to the first surface 10 of the second side assembly. First end 20 may be releasably attached to the first surface 10 or merely disposed over such first surface without being attached thereto. Methods of making leads having releasably attached first ends are disclosed in commonly assigned U.S. patent applications Ser. No. 09/200,100 filed on Nov. 25, 1998, entitled "Connection Component with Peelable Leads"; Ser. No. 09/020,750 filed on Feb. 2, 1998, entitled "Components with Releasable Leads"; Ser. No. 09/195,371, Filed on Nov. 18, 1998, entitled "Components with Releasable Leads"; and Ser. No. 09/225,669, filed Jan. 5, 1999, entitled "Components with Releasable Leads", Ser. No. 09/471,973, filed Dec. 23, 1999; and Ser. No. 09/290,975, filed Apr. 13, 1999 the disclosures of which are hereby incorporated by reference herein. Releasably attached leads may also be formed as disclosed in certain embodiments of U.S. Pat. Nos. 5,904,498; 5,763,941; 5,518,964; and International Publication No. WO94/03036, the disclosures of which are also hereby incorporated by reference herein.

Second side assembly 8 also preferably comprises holes 16 extending from the first surface 10 to the second surface 12 and disposed under the second ends 22 of the leads 18. In embodiments having traces connected to the leads 18 through vias in the second side assembly 8, some of the holes 16 may be utilized as the vias.

A first resilient element 25 is interposed between the first side assembly 1 and second side assembly 8. The first resilient element 25 may comprise a plurality of individual pads 26, as depicted in FIG. 1. The resilient element may be formed as disclosed in certain embodiments of U.S. Pat. Nos. 5,659,952; 6,133,639; and 6,169,328, the disclosures of which are hereby incorporated by reference herein.

Figure 2:
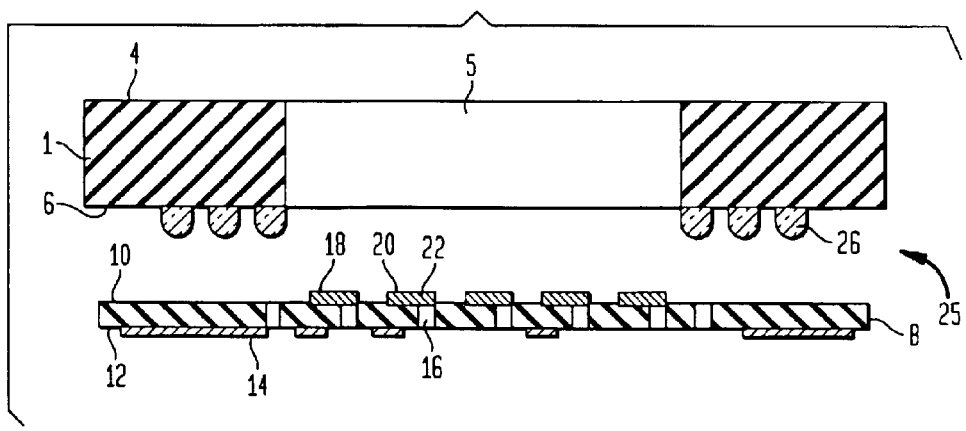
FIG. 2 is the cross-sectional view of FIG. 1 at a later stage in the method.

The plurality of pads 26 are preferably attached to the first side assembly, but may be attached to the second side assembly or otherwise disposed between the first side assembly and second side assembly. The first resilient element comprises any resilient material, including silicone elastomers. The resilient element may comprise a spring or a foam pad. In certain preferred embodiments, the plurality of pads 26 are formed on the bottom surface 6 of the first side assembly 1 by, for example, stenciling a curable composition onto the bottom surface 6 of the first side assembly and curing such composition. (FIG. 2). The curable composition is preferably curable to a resilient material. In preferred embodiments, the curable composition cures to a material having a "low compression set". As used herein, the term "low compression set" means a material which regains most or all of its original height after being subjected to a compressive force. In preferred embodiments, the resilient element 25 is made of a material which will regain 80 to 100% of its original height after being subjected to a compressive force.

Preferred curable compositions include compositions that cure to elastomers. Compositions curable to silicone elastomers are highly preferred.

Figure 3:
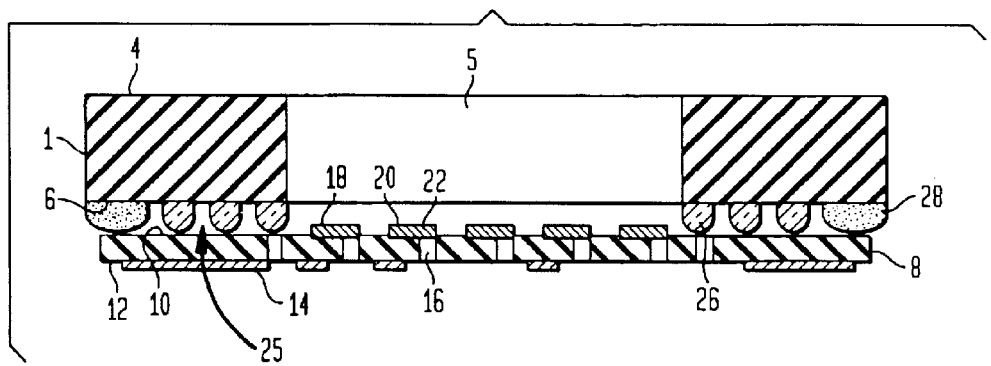
FIG. 3 is the cross-sectional view of FIGS. 1 and 2 at a later stage in the method.

The first side assembly 1 is juxtaposed with second side assembly 8, interposing the first resilient element 25 between the first side assembly and second side assembly. The first side assembly 1 is preferably attached to the first surface 10 of the second side assembly 8. The first side assembly 1 may be attached to the second side assembly 8 using, for example, a bead of adhesive 28 as depicted in FIG. 3. In the alternative, an adhesive may be disposed on the first resilient element 25, for attaching the first resilient element to the second side assembly.

Figure 4:
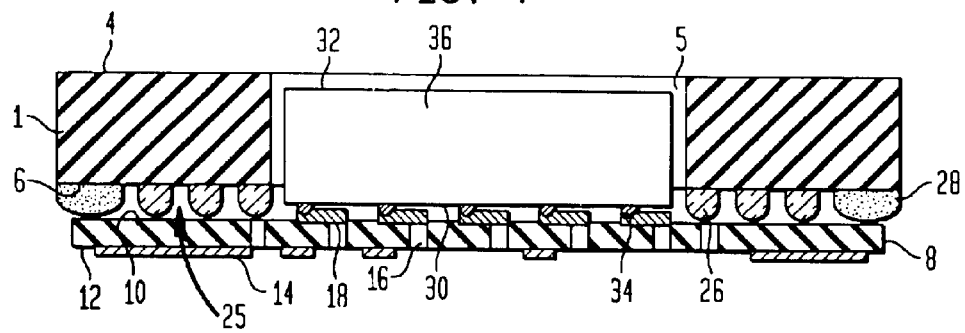
FIG. 4 is the cross-sectional view of FIGS. 1–3 at a later stage in the method.

The first assembly 1 preferably includes a microelectronic element. As depicted in FIG. 4, a microelectronic element 36, such as a semiconductor chip, is disposed within aperture 5. The microelectronic element may also comprise a plurality of semiconductor chips, such as a wafer having a plurality of semiconductor chips, a connection component, a substrate, carrier, support, or sacrificial layer. Microelectronic element 36 has a face surface 30, a back surface 32 facing in a direction away from face surface 30, and a plurality of contacts 34. The contacts 34 preferably protrude from face surface 30 and the microelectronic element 36 is placed in aperture 5 so that the contacts 34 face second side assembly 8. Thus, the first ends 20 are spaced so that the contacts 34 on the microelectronic element 36 and the first ends 20 are aligned. The contacts 34 are attached to the first ends 20 of the leads 18 so that the leads extend from the first side assembly 1 to the second side assembly 8.

In preferred embodiments, contacts 34 are solder masses, such as C4 solder balls and are preferably bonded to the first ends 20 of the leads 18. For example, solder balls may be bonded to the microelectronic element before being placed in aperture 5. The microelectronic element is placed in the aperture 5 and the solder is reflowed while in contact with the first ends 20 of the leads 18. The heat may be applied to the solder balls to bond them to the microelectronic element and the microelectronic element may be placed in the aperture 5 while the solder balls are still in a molten form so that the solder balls bond to the first ends 20.

The contacts 34 may comprise any material for forming an electrical connection between the microelectronic element and the leads 18 of the second side assembly 8. For example, the contacts 34 may include conductive adhesives and the contacts 34 may be adhered to the leads 18 utilizing the conductive adhesive. Contacts 34 may also comprise eutectic solder bumps, gold pads, or other joining materials. Bonding materials may be applied to the microelectronic element utilizing stenciling, plating, or other known methods.

A structure 40 is preferably juxtaposed over the back surface 32 of microelectronic element 36 and the top surface 4 of first side assembly 1. Preferably, the structure 40 comprises a heat spreader. The structure 40 has an alpha surface 42 facing the back surface 32 of the microelectronic element 36 and a beta surface 44 facing oppositely from the alpha surface 42. In preferred embodiments, the heat spreader is comprised of a metal or another highly thermally conductive material. An adhesive 46, such as a die attach adhesive, is disposed on the alpha surface 42. The volume of the adhesive used is preferably sufficient to compensate for thickness variations in the second side assembly 8, the first resilient element 25, the microelectronic element 36, the first side assembly 1 and the structure 40. In preferred embodiments, the adhesive 46 is compliant. Fast curing or snap curing die attach adhesives are also preferred. The adhesive is also preferably thermally conductive. Preferred adhesives include silicone elastomers and flexiblized epoxies.

Figure 5:
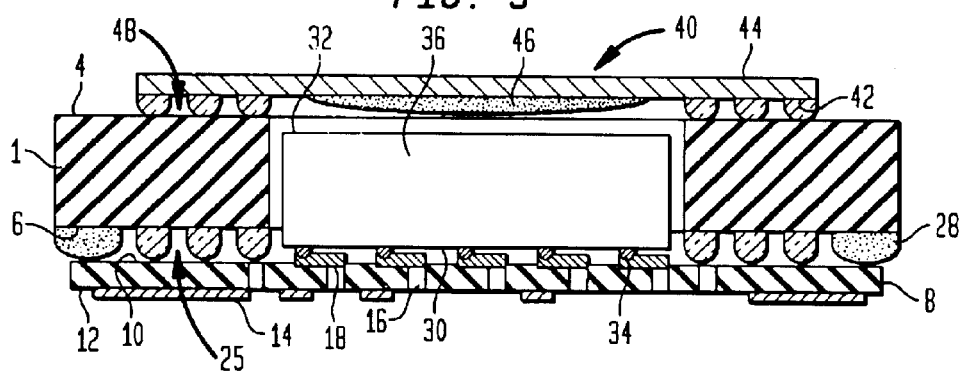
FIG. 5 is the cross-sectional view of FIGS. 1–4 at a later stage in the method.
Figure 6:
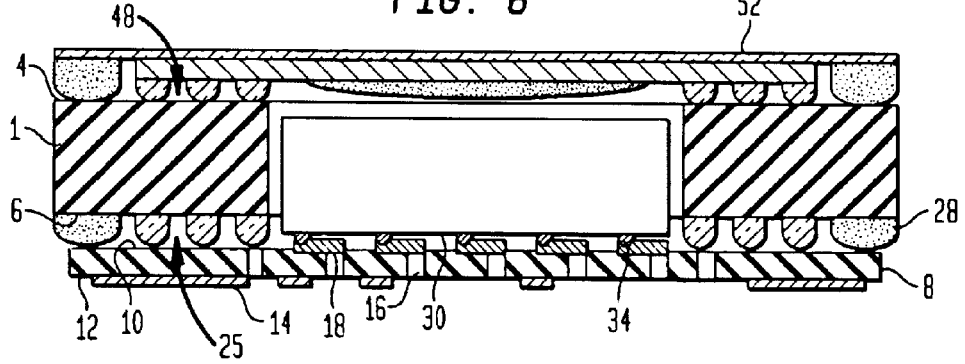
FIG. 6 is the cross-sectional view of FIGS. 1–5 at a later stage in the method.

In preferred embodiments and as depicted in FIG. 5, the structure 40 includes a second resilient element 48 disposed on alpha surface 42. Second resilient element 48 is preferably comprised of the same or similar materials as the first resilient element 25 described above. Alternatively, the second resilient element 48 may be provided on the top surface 4 of the first side assembly 1 or may be omitted.

Preferably, a coverlay 52 is disposed over the structure 40 and the first side assembly 1. (FIG. 6) The coverlay 52 may be laminated to the structure 40, adhered to the back surface 4 of the first side assembly 1 using an adhesive, or otherwise attached. Adhesive for attaching the coverlay may be the same or different from adhesive 46 and adhesive 28.

Figure 7:
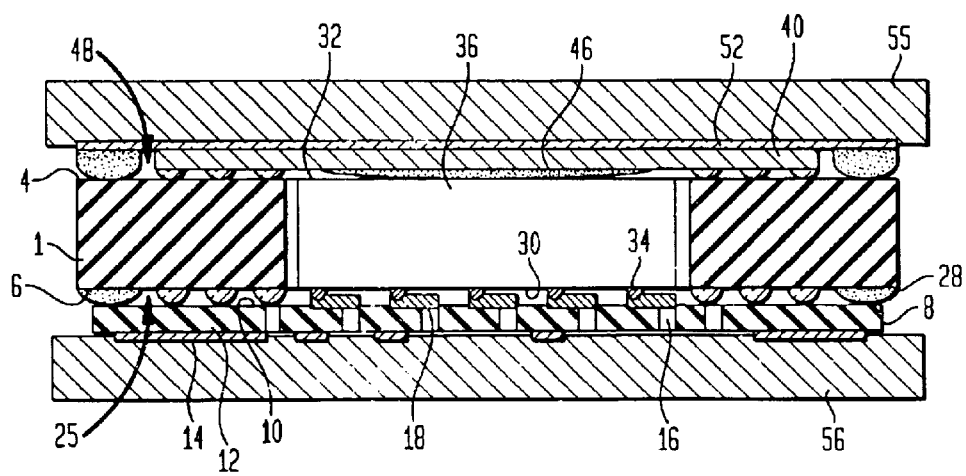
FIG. 7 is the cross-sectional view of FIGS. 1–6 at a later stage in the method.

A compressive force is applied to the assembly to compress at least first resilient element 25. (FIG. 7). In preferred embodiments, adhesive 46 is cured while such compressive force is applied. The compressive force may be applied, as depicted in FIG. 7, by disposing the assembly between a first platen 55 and a second platen 56 and urging the first and second platens toward one another to compress the first resilient element 25 and second resilient element 48. Other methods of applying compressive forces known in the art may also be employed. Such other methods include, but are not limited to, the application of elevated pressure and/or vacuum.

The compressive force should be sufficient to compress the resilient elements such that, upon removal of the compressive force, the resiliency in the resilient elements will move the first ends 20 of the leads 18 away from the first surface 10 of the second side assembly 8. If the first ends 20 are releasably attached to the first surface 10, the resiliency in the resilient elements must be sufficient to peel the first ends 20 from the first surface 10. For example, when the first resilient element 25 comprises a plurality of silicone pads having a diameter of approximately 20 mils and a height of about 4–10 mils, and the second resilient element 48 comprises similar pads, a compressive force sufficient to compress each of the pads about at least 0.002 inches is generally preferred. In the foregoing example, but only having a first resilient element 25, a force sufficient to compress each of the pads at least about 0.004 inches is preferred. To determine the amount of compressive force needed, one may determine the force needed to vertically extend the plurality of leads 18 and then determine the amount of force to be used in the compression of the pads. Generally, the preferred compressive force is sufficient to compress the resilient elements such that such resilient elements lift the microelectronic element 2–4 mils when the compressive force is removed.

Figure 8:
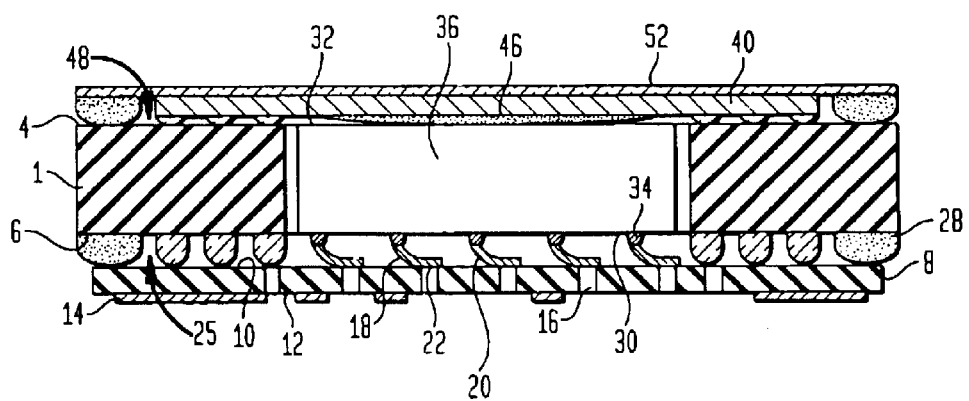
FIG. 8 is the cross-sectional view of FIGS. 1–7 at a later stage in the method.

As mentioned above, in preferred embodiments, the adhesive 46 is preferably cured while the resilient elements are compressed. After the adhesive 46 is cured, the compressive force is removed and the leads 18 are vertically extended, as depicted in FIG. 8. The first ends 20 of the leads 18 are not attached, or are releasably attached to the second side assembly 8. The second ends 22 are attached to the second side assembly 8 so that the leads are deformed and extend vertically from the microelectronic element 36 of the first side assembly 1 to the second side assembly 8. The compressed resilient elements increase in height, causing the first side assembly 1 and the second side assembly 8 to move apart from each other. The back surface 32 of the microelectronic element 36 is adhered to the structure 40 so that the microelectronic element 36 moves in relation to the second side assembly 8. Since the first ends 20 of the leads 18 are connected to the contacts 34 on the microelectronic element 36, the first ends 20 of the leads 18 move in relation to the first surface 10.

Figure 9:
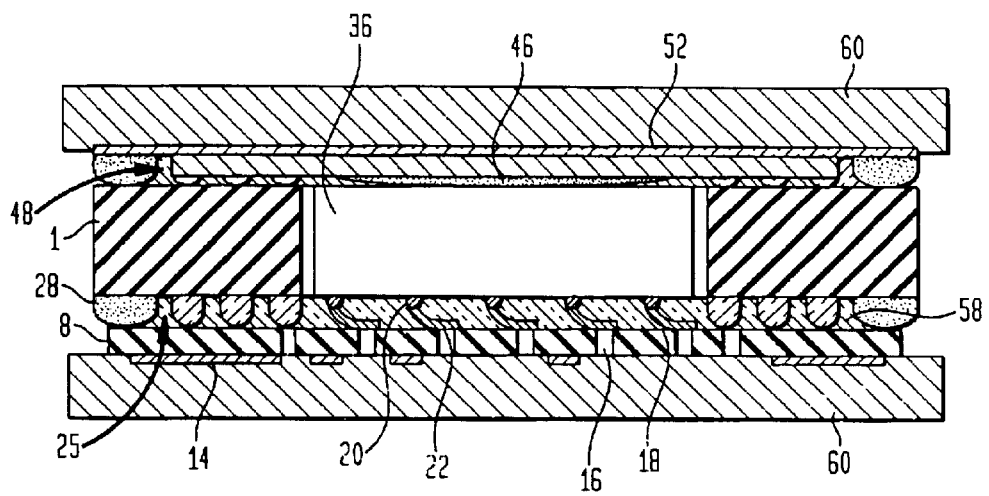
FIG. 9 is the cross-sectional view of FIGS. 1–8 at a later stage in the method.

Preferably, the leads, and more preferably the entire assembly, is encapsulated. In preferred embodiments, at least the leads 18 are encapsulated with a first composition curable to a compliant layer. Preferred first compositions include compositions curable to a silicone elastomer or a flexiblized epoxy. As depicted in FIG. 9, the entire assembly may be encapsulated with a first composition 58.

In certain preferred embodiments, the first side assembly 1 comprises a material having a coefficient of thermal expansion (hereinafter "CTE") that is less than the CTE of the resilient element and more preferably lower than the CTE of the material used as the encapsulant 58 (See FIG. 9). In preferred embodiments, the CTE of the carrier frame is approximately 10 to 50 ppm/C, more preferably 16–20 ppm/C, and even more preferably matched to the CTE of the first element.

The leads may be encapsulated in a first composition and the rest of the assembly may be encapsulated in a second composition different from the first composition. However, in preferred embodiments, both the leads and the rest of the assembly are encapsulated in a first composition curable to a compliant layer.

The first composition 58 is preferably a liquid before curing and one or more coverlays preferably contain the liquid composition between the first side assembly 1 and second side assembly 8. The coverlays are generally removed after the encapsulation or cure step. The encapsulation process may be accomplished by dispensing the composition, injecting the composition, or using any of the known methods for applying encapsulations. If an injection process is used, a fixture or mold 60 may used to contain the composition between the first side assembly 1 and second side assembly 8. (FIG. 9)

In preferred embodiments, the first composition 58 is at least partially cured while the assembly is in fixture 60. The curing of the first composition may completed in a curing oven.

Figure 10:
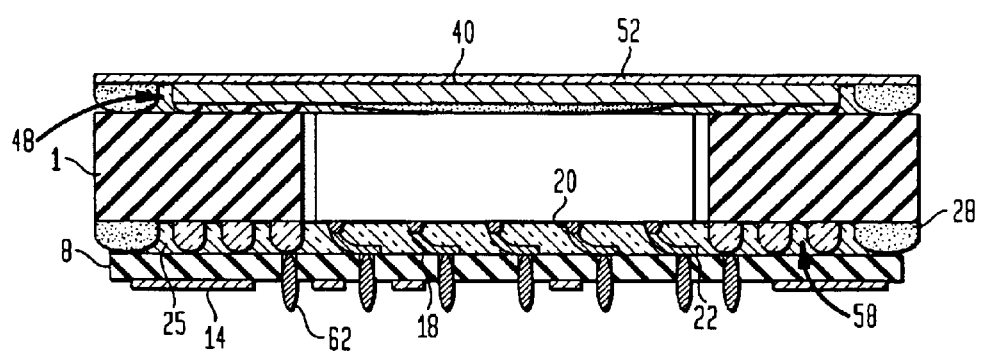
FIG. 10 is the cross-sectional view of FIGS. 1–9 at a later stage in the method.

Electrically conductive elements, such as solder balls 62, are preferably connected at the second surface 12 of the second side assembly 8. (FIG. 10). Preferably, each of the solder balls 62 is electrically connected to a second end 22 of one of the leads through one of the holes 16. The electrically conductive elements may include, for example, solder balls, solder pads or lands, and/or traces. Preferably, such electrically conductive elements are electrically interconnected to the second ends 22 of the leads. The conductive elements may or may not be connected to the second conductive features 14 on second surface 12. In embodiments having traces on second surface 12, solder balls may be connected to the traces and to second ends 22 of the leads 18, through holes 16.

Figure 11:
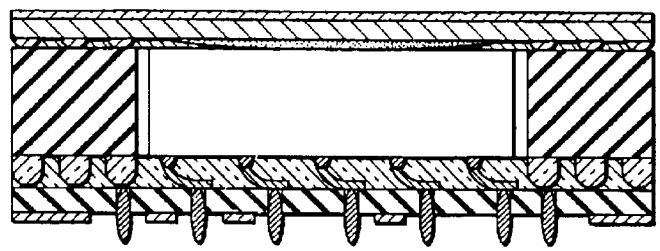
FIG. 11 is the cross-sectional view of FIGS. 1–10 at a later stage in the method.

As depicted in FIG. 11, the edges of the assembly may be trimmed in a dicing or singulation process. If a plurality of microelectronic packages are simultaneously made, the assembly is cut to form individual assemblies, each preferably having a microelectronic element.

Figure 12:
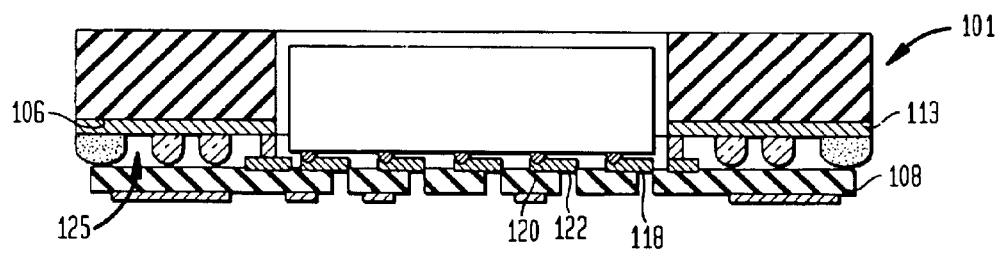
FIG. 12 is a cross-sectional view of a first side assembly, second side assembly and resilient layer in another embodiment of the invention.
Figure 13:
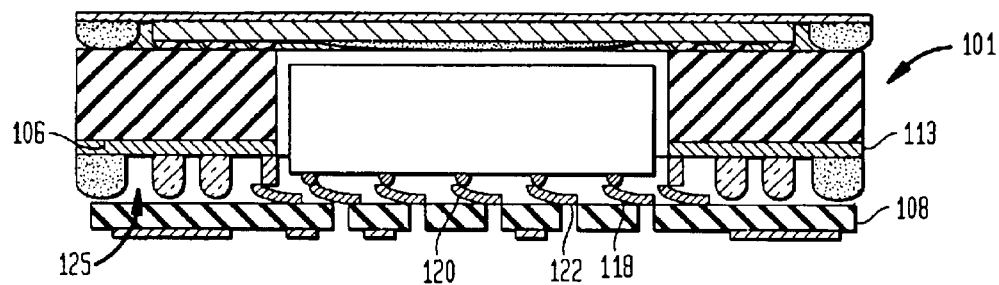
FIG. 13 is the cross-sectional view of FIG. 12 at a later stage in the method.

In another embodiment of the invention, as depicted in FIG. 12, the first side assembly 101 preferably includes a conductive plane 113, such as a layer of copper, disposed on the bottom surface 106. Such conductive plane 113 may be electrically isolated from the leads 118 of the second side assembly 108 or may be electrically interconnected to such leads. In preferred embodiments, the conductive plane 113 is electrically interconnected to such leads 118, as shown in FIG. 12, and forms a ground plane. The electrical interconnection is preferably obtained by bonding a portion of the ground plane 113 to a first end 120 of one of the leads 118 and then vertically extending such lead 118, during the step of vertically extending the leads 118. Preferably, the portion of the plane 113 bonded to one of the leads 118 is flexible so that the first resilient element 125 may be compressed. (See FIG. 13).

Figure 14:
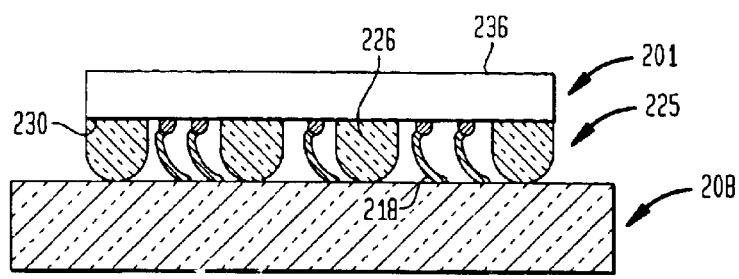
FIG. 14 is a cross-sectional view of a first side assembly, second side assembly and resilient layer in a further embodiment of the invention.

In other embodiments of the invention, the structure 40 and/or the second resilient element 48 are omitted. As shown in FIG. 14, a first side assembly 201 comprises a microelectronic element, such as a microelectronic chip 236 juxtaposed with a second side assembly 208. A resilient element 225 is disposed between the first side assembly 201 and second side assembly 208. Leads 218 of the second side assembly 208 extend between the first side assembly 201 and the second side assembly 208. FIG. 14 shows a first resilient element 225 in the form of pads 226 in contact with a first face 230 of the microelectronic element 236, after the pads have been allowed to expand.

Figure 15:
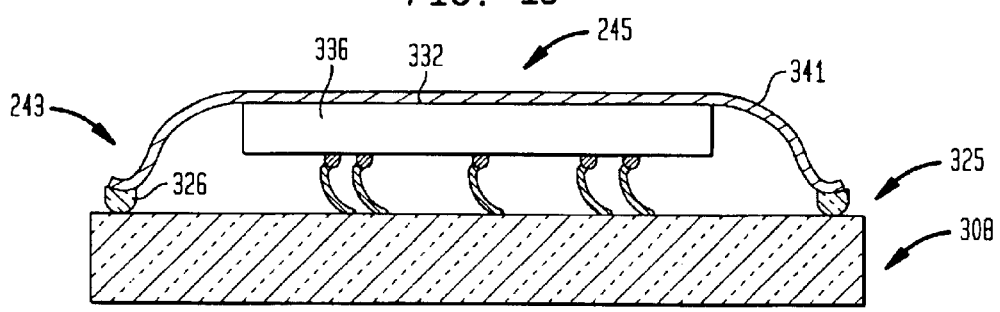
FIG. 15 is a cross-sectional view of a first side assembly, second side assembly and resilient layer in another embodiment of the invention.

A variety of structures having numerous forms may be included in the first side assembly 1. For example, FIG. 15 shows another embodiment of the invention, in which an auxiliary element 341 has been attached to a second face 332 of the microelectronic element 336. A first resilient element 325 in the form of a plurality of pads 326 are disposed between the auxiliary element 341 and the second side assembly 308. The resilient pads 326 are attached to a peripheral region 243 of the auxiliary element 241 and the microelectronic element 336 is attached to a central region 245 of the auxiliary element 241.

Figure 16:
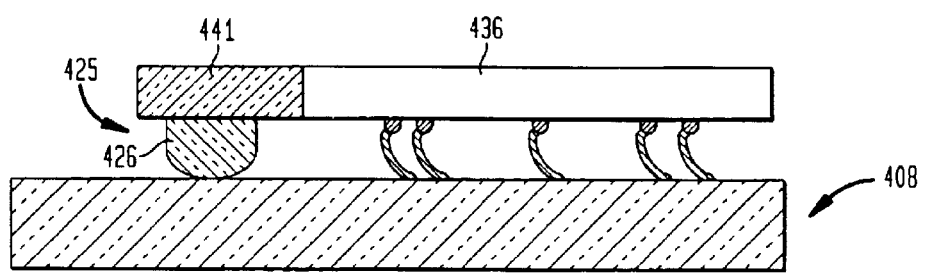
FIG. 16 is a cross-sectional view of a first side assembly, second side assembly and resilient layer in a further embodiment of the invention.

FIG. 16 shows another embodiment of the invention, in which an auxiliary element 441 is in the form of at least one post alongside the microelectronic element 436. The post is attached to the microelectronic element 436 and a resilient element 425 is attached to the post and the second side assembly 408. The resilient element 425 comprises a unitary continuous pad 426. Auxiliary elements having other forms may be connected to the microelectronic element. For example, a ring or frame may be connected to the microelectronic element.

Figure 17:
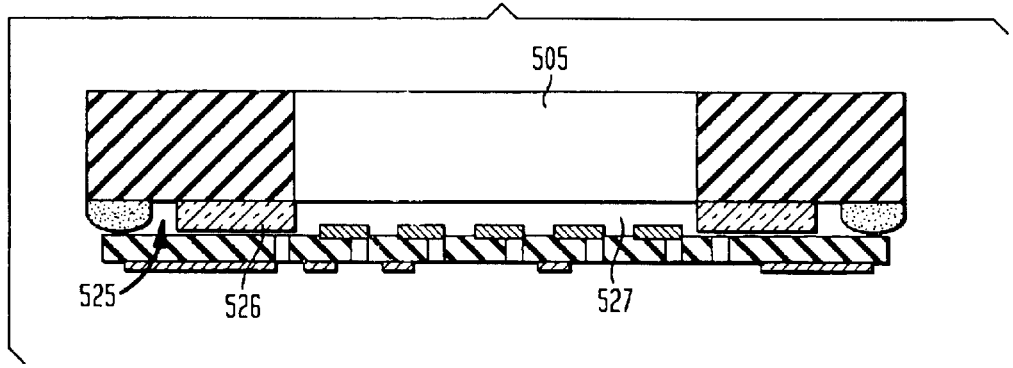
FIG. 17 is a cross-sectional view of a first side assembly, second side assembly and resilient layer in a further embodiment of the invention.
Figure 18:
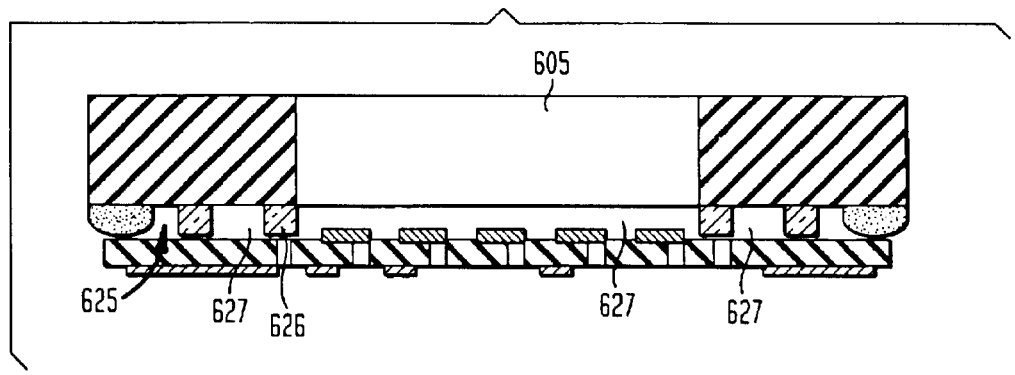
FIG. 18 is a cross-sectional view of a first side assembly, second side assembly and resilient layer in another embodiment of the invention.

In other preferred embodiments, the first resilient element 25 comprises a unitary pad with a plurality of openings, as depicted in FIG. 18. In further preferred embodiments, the first resilient element comprises a continuous pad, as depicted in FIG. 17. The resilient elements may be provided separately from the first side assembly and second side assembly. For example, as disclosed in certain embodiments of U.S. patent application Ser. No. 08/879,922, filed Jun. 20, 1997, the disclosure of which is hereby incorporated by reference herein, a transferable resilient element having a tacky surface region may be provided on a liner. After removing the liner, the element is attached to the first side assembly, second side assembly, or both.

In FIG. 17, the first resilient element 525 comprises a unitary pad 526 having an opening 527. Opening 527 is generally centrally located and sized to correspond with aperture 505. FIG. 18 depicts an embodiment having a first resilient element 625 comprising a pad 626 having a plurality of openings 627. One of the openings 627 is sized to correspond to aperture 605. The pad 526 and pad 626 may be made by forming a layer of a resilient material, preferably having a low compression set, and utilizing a punch tool to cut out the openings in the layer. The first and second resilient elements may comprise layers having virtually any shape.

These and other variations and combinations of the features discussed above can be utilized without departing from the invention. For example, the microelectronic element may be placed upon or bonded to the second side assembly before assembling the first side assembly with the second side assembly. In addition, the contacts of the microelectronic element could be bonded to the leads on the second side assembly concurrently with the step of applying a compressive force to the first side and second side assemblies. Thus, the foregoing description of the preferred embodiments should be taken by way of illustration rather than by way of limitation of the invention as defined by the claims.

What is claimed is:

1. A method of making a microelectronic assembly, comprising the steps of:
   a) providing a first side assembly having a top surface and an oppositely facing bottom surface, and a second side assembly having a first surface so that the bottom surface of the first side assembly is juxtaposed with the first surface of the second side assembly;
   b) providing leads extending between the first side assembly and the second side assembly and a first resilient element disposed between the first side assembly and the second side assembly;
   c) applying a compressive force to the juxtaposed assemblies so as to compress the first resilient element; and
   d) at least partially releasing the compressive force so as to allow the first resilient element to expand, thereby moving one or both of the first side assembly and the second side assembly to deform the leads.

2. The method of claim 1, wherein the step of providing a first side assembly includes providing a microelectronic element.

3. The method of claim 2, wherein the step of providing a first resilient element includes attaching the first resilient element to the first side assembly.

4. The method of claim 3, wherein the step of providing leads comprises providing leads extending between the microelectronic element and the second side assembly.

5. The method of claim 4, wherein the leads have a first end and a second end, the microelectronic element includes contacts, and the method further comprises bonding the first end of one of the leads to each of the contacts, wherein the second ends of each of the leads is attached to the second side assembly.

6. The method of claim 4, wherein the step of providing a first side assembly includes providing a frame having an aperture for receiving a microelectronic element and the step of providing a first side assembly includes inserting the microelectronic element into the aperture.

7. A method of making a microelectronic assembly, comprising the steps of:
   a) providing a first side assembly having a top surface and an oppositely facing bottom surface, and a second side assembly having a first surface so that the bottom surface of the first side assembly is juxtaposed with the first surface of the second side assembly;

b) providing leads extending between the first side assembly and the second side assembly and a first resilient element disposed between the first side assembly and the second side assembly, wherein the at least one resilient element comprises a material having a low compression set;

c) applying a compressive force to the juxtaposed assemblies so as to compress the first resilient element; and d) at least partially releasing the compressive force so as to allow the first resilient element to expand, thereby moving one or both of the first side assembly and the second side assembly to deform the leads.

8. The method of claim 7, wherein the low compression set material has an initial height before the step of applying a compressive force and a final height after the step of at least partially releasing the compressive force, the final height being between 80% to 100% of the initial height.

9. The method of claim 8, wherein the low compression set material is comprised of a silicone elastomer or a flexiblized epoxy.

10. A method of making a microelectronic assembly, comprising the steps of:

a) providing a first side assembly having a top surface and an oppositely facing bottom surface, and a second side assembly having a first surface so that the bottom surface of the first side assembly is juxtaposed with the first surface of the second side assembly;

b) providing leads extending between the first side assembly and the second side assembly and a first resilient element disposed between the first side assembly and the second side assembly, wherein the at least one resilient element is porous;

c) applying a compressive force to the juxtaposed assemblies so as to compress the first resilient element; and d) at least partially releasing the compressive force so as to allow the first resilient element to expand, thereby moving one or both of the first side assembly and the second side assembly to deform the leads.

11. A method of making a microelectronic assembly, comprising the steps of:

a) providing a first side assembly having a top surface and an oppositely facing bottom surface, and a second side assembly having a first surface so that the bottom surface of the first side assembly is juxtaposed with the first surface of the second side assembly, wherein the step of providing a first side assembly includes providing a microelectronic element and at least one auxiliary element;

b) providing leads extending between the first side assembly and the second side assembly and a first resilient element disposed between the first side assembly and the second side assembly, wherein the step of providing leads comprises providing leads extending between the microelectronic element and the second side assembly, and the step of providing a first resilient element includes attaching the first resilient element to the first side assembly and providing the first resilient element between the at least one auxiliary element and the second side assembly;

c) applying a compressive force to the juxtaposed assemblies so as to compress the first resilient element; and d) at least partially releasing the compressive force so as to allow the first resilient element to expand, thereby moving one or both of the first side assembly and the second side assembly to deform the leads.

12. The method of claim 11, wherein the auxiliary element is disposed adjacent the microelectronic element so as to confront at least one of the first side assembly and the second side assembly.

13. The method of claim 12, wherein the auxiliary element has a central region extending over a surface of the microelectronic element and a peripheral region lying outwardly of the central region, the first resilient element including at least one resilient pad disposed between the peripheral region and the second side assembly.

14. The method of claim 13, wherein the step of providing a first side assembly includes attaching the central region of the auxiliary element to the microelectronic element.

15. The method of claim 11, wherein the step of providing a first side assembly includes providing at least one auxiliary element comprising at least one post extending alongside the microelectronic element.

16. The method of claim 15, wherein the step of providing a first resilient element includes attaching the first resilient element to the at least one post so that the at least one resilient element extends between the at least one post and the second side assembly, and attaching the at least one post to the microelectronic element.

17. The method of claim 1, wherein the first side assembly comprises a flexible dielectric layer.

18. The method of claim 1, wherein the step of providing leads includes providing leads having a first end permanently attached to the second side assembly and a second end releasably attached to the second side assembly.

19. The method of claim 18, wherein, during the step of at least partially releasing, the second ends of the leads are peeled from the first surface of the first element.

20. The method of claim 4, wherein the step of providing leads includes providing leads on the microelectronic element and bonding the leads to the second side assembly.

21. A method of making a microelectronic assembly, comprising the steps of:

a) providing a first side assembly having a top surface and an oppositely facing bottom surface, and a second side assembly having a first surface so that the bottom surface of the first side assembly is juxtaposed with the first surface of the second side assembly;

b) providing leads extending between the first side assembly and the second side assembly and a first resilient element disposed between the first side assembly and the second side assembly, wherein the step of providing a first resilient element includes stencil printing a composition onto at least one of the first side assembly and the second side assembly;

c) applying a compressive force to the juxtaposed assemblies so as to compress the first resilient element; and d) at least partially releasing the compressive force so as to allow the first resilient element to expand, thereby moving one or both of the first side assembly and the second side assembly to deform the leads.

22. The method of claim 21, wherein the step of providing at least one resilient element includes stencil printing a curable composition and curing the curable composition.

23. The method of claim 4, further comprising juxtaposing a structure over the microelectronic element.

24. The method of claim 23, wherein the structure comprises a heat spreader.

25. The method of claim 23, further comprising providing a second resilient element on a surface of the structure facing the microelectronic element.

26. The method of claim 25, further comprising providing adhesive on the structure, on a surface of the structure which faces the microelectronic element.

27. The method of claim 26, wherein the adhesive is a curable adhesive and further comprising curing the adhesive during the step of applying a compressive force.

28. The method of claim 23, further comprising juxtaposing a coverlay over the structure and attaching the coverlay to the first side assembly.

29. The method of claim 1, further comprising encapsulating the deformed leads by disposing a curable composition around the leads and curing the curable composition.

30. The method of claim 29, wherein the cured composition is compliant.

31. The method of claim 1, wherein the first side assembly includes a plurality of microelectronic elements, the second side assembly includes a dielectric layer and the method further comprises after the step of introducing an encapsulant cutting through the dielectric layer around the microelectronic elements.

32. The method of claim 31, wherein the first side assembly includes a wafer having a plurality of microelectronic elements.

33. The method of claim 1, wherein the step of applying a compressive force comprises applying an elevated pressure to at least one surface of the first side assembly which faces away from the second side assembly.

34. The method of claim 1, wherein the step of applying a compressive force comprises applying a vacuum to at least one surface of the first side assembly which faces toward the second side assembly.

35. The method of claim 1, wherein the leads are comprised of a metal selected from the group consisting of copper, gold, gold alloys and copper alloys.

36. The method of claim 5, further comprising the step of attaching solder balls to the second side assembly, wherein each of said solder balls is electrically interconnected to one of the second ends of one of the leads.

37. The method of claim 1, wherein the first side assembly further includes a conductive plane disposed on a bottom surface thereof.

38. A microelectronic package made according to the method of claim 1.

* * * * *